United States Patent
Dishman et al.

(10) Patent No.: US 7,830,991 B2
(45) Date of Patent: Nov. 9, 2010

(54) FREQUENCY SELECTIVE AUTOMATIC GAIN CONTROL WITH DUAL NON-SYMMETRIC ATTACK AND RELEASE TIMES AND INTERFERENCE DETECTION FEATURE

(75) Inventors: John F. Dishman, Melbourne, FL (US); Edward R. Beadle, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 990 days.

(21) Appl. No.: 11/243,289

(22) Filed: Oct. 3, 2005

(65) Prior Publication Data
US 2007/0076783 A1 Apr. 5, 2007

(51) Int. Cl.
*H04L 27/08* (2006.01)

(52) U.S. Cl. .................. 375/345; 375/316; 330/129; 455/234.1

(58) Field of Classification Search .......... 375/316, 375/345
See application file for complete search history.

(56) References Cited

U.S. PATENT DOCUMENTS

| | | | | |
|---|---|---|---|---|
| 5,029,182 | A | 7/1991 | Cai et al. ........................ 375/1 |
| 5,917,865 | A * | 6/1999 | Kopmeiners et al. ........ 375/345 |
| 6,038,435 | A | 3/2000 | Zhang ...................... 455/234.1 |
| 6,563,891 | B1 | 5/2003 | Eriksson et al. ............. 375/345 |
| 6,658,069 | B1 | 12/2003 | Imura ......................... 375/345 |
| 6,775,337 | B2 * | 8/2004 | Janky et al. ................. 375/345 |
| 6,799,023 | B2 | 9/2004 | Pinola et al. .............. 455/234.1 |
| 6,868,263 | B2 | 3/2005 | Filipovic ................. 455/245.1 |
| 7,027,530 | B2 * | 4/2006 | McFarland et al. .......... 375/341 |
| 7,304,969 | B2 * | 12/2007 | Ryan et al. .................. 370/332 |
| 7,366,490 | B2 * | 4/2008 | Rouphael et al. ......... 455/234.1 |
| 7,450,907 | B2 * | 11/2008 | Shurvinton et al. ...... 455/67.11 |
| 2003/0078011 | A1 * | 4/2003 | Cheng et al. .................. 455/73 |
| 2003/0161411 | A1 * | 8/2003 | McCorkle et al. ........... 375/295 |
| 2003/0162518 | A1 * | 8/2003 | Baldwin et al. .......... 455/253.2 |
| 2005/0130615 | A1 * | 6/2005 | Darabi ..................... 455/232.1 |
| 2005/0215258 | A1 * | 9/2005 | Hanusch et al. .......... 455/452.1 |
| 2006/0120435 | A1 * | 6/2006 | Punzenberger et al. ...... 375/132 |
| 2006/0170499 | A1 * | 8/2006 | Rahman et al. ............. 330/279 |
| 2007/0053451 | A1 * | 3/2007 | French et al. ............... 375/260 |
| 2007/0058739 | A1 * | 3/2007 | Aytur et al. ................. 375/260 |
| 2007/0076827 | A1 * | 4/2007 | Beamish et al. ............. 375/345 |

OTHER PUBLICATIONS

Gradshteyn & Ryzhik, "Tables of Integrals, Series, And Products", Texbook, Academic Press, 1980, p. 7.

* cited by examiner

*Primary Examiner*—Shuwang Liu
*Assistant Examiner*—Kenneth Lam
(74) *Attorney, Agent, or Firm*—Allen, Dyer, Doppelt, Milbrath & Gilchrist, P.A.

(57) ABSTRACT

A digital signal processing-based receiver architecture performs automatic gain control (AGC) for a frequency hopping spread-spectrum communications receiver that may be subjected to one or more sources of interference or jamming. Rather than set the AGC gain at a fixed, best hoped for value, and then attempt to rely on decoding or interleaving to interpolate lost or degraded data, the present invention, through repeated but aperiodic transitions or hops across a plurality of frequency bins of interest, develops a gain profile for the plurality of frequency bins, and uses the gain profile to adjust, on a hop-by-hop basis, the gain for the channel/bin to which the receiver is listening, so as to maintain the average aggregate input signal power at an optimal ADC loading factor.

27 Claims, 4 Drawing Sheets

FREQUENCY SELECTIVE AUTOMATIC GAIN CONTROL WITH DUAL NON-SYMMETRIC ATTACK AND RELEASE TIMES AND INTERFERENCE DETECTION FEATURE

GOVERNMENT LICENSE RIGHTS

This invention was made with government support under contract No. AEHF-NMT N00039-04-C-0011 awarded by the U.S. Navy. The U.S. Government may have certain rights in the invention.

FIELD OF THE INVENTION

The present invention relates in general to communication systems and subsystems thereof, and is particularly directed to a digital signal processing-based receiver architecture that is operative to perform automatic gain control (AGC) for a system utilizing a frequency hopped spread spectrum waveform that may be subjected to one or more sources of interference.

BACKGROUND OF THE INVENTION

In the course of attempting to recover data transmitted over a communication channel, a digital receiver must set the input level of the aggregate desired signal plus noise and interference, henceforth referred to as the aggregate signal, at the input to the analog-to-digital converter such that effects of quantization on the desired signal are minimized. The aggregate signal level in to the analog-to-digital converter is set using a variable gain stage somewhere in the analog front-end preceding the digital receiver. If the gain of the analog front end is set to low, quantization noise will dominate and the number of effective bits of the analog-to-digital converter will be reduced. If the gain is set to high, the analog-to-digital converter will saturate, distorting the waveform and preventing the successful recovery of the data. Variation in the communication channel's propagation properties and the presence or absence of interference necessitate the use of some sort of automatic gain control to keep the aggregate signal level into the analog-to-digital converter at an optimal value over a large dynamic range.

To complicate matters, communications systems subjected to one or more sources of interference, intentional or otherwise, often employ some form of frequency hopping scheme, through which the receiver transitions or 'hops' from (the center frequency of) one frequency bin to another, and looks for energy in the hopped-to bin, during a relative brief 'hop' interval. One of the problems that must be faced with this type of system is the fact that the receiver doesn't know a priori which frequency bin will possess interference.

For example, there may exist a relatively narrowband jammer emitting in or near a frequency bin to which the receiver hops only occasionally. If the gain level of the input to the receiver's analog-to-digital converter (ADC) is set at some mean value, then hopping to the jamming band will result in saturating the ADC, causing a data packet to be occasionally lost, thereby degrading system throughput. On the other hand, if the gain is set at a value based upon the impact of the jammer in that one band, then when the receiver is hopping to and collecting energy in other bands, the ADC is underloaded, introducing quantization noise and causing an unwanted degradation in performance.

Moreover, the use of frequency hopping over wide bandwidths causes additional aggregate signal level dynamics, as a function of frequency, due to the large gain variations typical of cost-effective analog frontends.

The prior art has customarily set the gain at a value based on the mean value of the aggregate input signal level over the entire spread bandwidth (with some overhead reserved for jamming) and then attempts to rely on interleaving and decoding to overcome the performance degradation caused by not optimally loading the ADC.

SUMMARY OF THE INVENTION

Rather than set the AGC gain at a fixed, best hoped for value, and then attempt to rely on decoding or interleaving to interpolate lost or degraded data, the present invention, through repeated but aperiodic transitions or hops across a plurality of frequency bins of interest, develops a gain profile for the plurality of frequency bins, and uses the gain profile to adjust, on a bin-by-bin basis, the gain for the channel/bin to which the receiver is listening, so as to maintain the average aggregate input signal power at an optimal (e.g., 10 bit) ADC loading factor. To this end, the overall architecture of the automatic gain control in accordance with a preferred embodiment of the present invention includes a front-end hardware section through which a signal is received, and an associated digital processor-resident software section to which the output of the hardware section is coupled, and which is used to control the gain of a variable gain front end amplifier stage of the hardware section in accordance with a multifrequency bin-based gain profile developed by the software section in the course of its analysis of the energy in the various frequency bins to which the receiver hops. Pursuant to a preferred embodiment, the automatic gain control (AGC) function is implemented in the digital signal processor section and is responsible for maintaining the aggregate signal plus noise plus interference (herein referred to as the aggregate input signal) within the dynamic range of an analog-to-digital converter (ADC) as well as for detecting demodulator input signal out of range faults and gross downlink interference. As will be described, the AGC function uses a frequency selective, first order, automatic gain control algorithm to control the analog front end's gain to keep the average aggregate input signal power at an optimal multi-bit (e.g., 10 bit) ADC loading factor.

The received input signal is coupled to a software controlled variable gain stage, the output of which is coupled to the input of the ADC. The digital quantity produced by the ADC corresponds to the received signal r(n) multiplied by a prescribed gain quantity $G_k^{(lk)}$ supplied to the variable gain stage from the gain profile-generating software section. The power in this signal sample representation is derived in a power calculation block which derives the quantity:

$$\frac{(G_k^{(lk)})^2}{N} \sum_{n=0}^{N-1} |r(n)|^2$$

This quantity is delayed in a delay block to account for propagation delay in the execution of operations in the digital signal processor, to be described, and then converted into logarithmic format in a log base 10 conversion stage to produce a measured and gain adjusted signal energy quantity $P_{issi}^{(ik-D)}$ (k−D), which is supplied in turn to an inverting (−) input of summation operator to a non-inverting (+) input of which is supplied an optimal loading factor $LF_{opt}$.

As described briefly above, and as will be detailed below, the AGC algorithm is frequency selective, and adapts to different aggregate input signal conditions in a prescribed number of frequency bins (such as 32 bins as a non-limiting example), where the width of an individual frequency bin corresponds to a 30 MHz range of adjacent RF center frequencies. The frequency bin for a given hop is based on the hop's center frequency.

The AGC function initializes and starts the AGC frequency selective mechanism with a pre-determined initial gain profile. This pre-determined gain profile may be determined by link budget analysis or may be stored from a previous operation of the system.

As pointed out above, the AGC mechanism of the present invention is a frequency selective, dual bandwidth, first order, automatic gain control loop. The respective components of the AGC mechanism run a dual bandwidth AGC loop in each of up to 32 frequency bins in the present example, with each frequency bin AGC_Bin corresponding to a range of frequencies (32×30 MHz=960 MHz). Due to the random frequency hopping on the downlink, the frequency bin sampling period is random.

For each hop, the demodulator signal processing makes a 16 bit input signal strength indicator (ISSI) measurement from the ADC output as $$issi(k) = \text{round}\left(\frac{1}{4*44,352}\sum_{n=0}^{44,351} |x_k(n)|^2\right) \quad (1)$$

where x(n) is a ten-bit ADC sample for the kth HHR hop/HHR interval. The frequency of the hop is saved for determining the frequency bin a given ISSI value was taken in. This frequency bin value is designated as $l_k$.

Once the frequency bin $l_k$ is determined for the hop, the gain setting (in dB), $g_k^{(lk)}$, for that frequency bin is looked up in a current gain profile vector GP(k) operator, and quantized to a 0.5 dB step size by a 0.5 dB quantizer operator. The gain profile vector is stored in an unquantized, floating point format to avoid setting an upper limit on the AGC's attack/release time.

Once the AGC function receives the ISSI vector from the hardware, the algorithm uses the ISSI vector, along with the corresponding vector of frequency bins, to calculate a gain error for the $k^{th}$ hop as:

$$E_{gain}^{(lk)}(k) = LF_{opt} - 10\ LOG_{10}(issi(k)/2^{15})$$

The optimal loading factor, $LF_{opt}$, is defined as the ratio of the average power of the aggregate input signal to the power of a sine wave with an amplitude equal to the ADC's full scale. For a 10-bit ADC, as a non-limiting example, a full scale sine wave will result in an ISSI measurement of 32,640 which is approximated as $2^{15}$ in the above equation. The gain error from a summation operator is then used to update the gain profile value for the corresponding frequency bin.

As noted above, the loading factor is defined as the ratio of the average power of the aggregate input signal to the power of a sine wave with it's amplitude equal to the ADC's full scale. If an ADC is underloaded, the digital demodulator's ADC quantization noise can degrade the receiver's G/T. For a 10-bit ADC of the present example, the quantization noise density, $ADC\_N_o$, at the nominal sample rate is −134.6 dBfs-Hz (at the input to the ADC; ~7.85 effective bits at −12 dBfs). The loading factor is selected such that the G/T is degraded by a value determined in allocating the demodulator's implementation loss during the link budget process. The loading factor $LF_{opt}$ is set to:

$$LF_{opt} = \lceil \rceil \div ADC\_No - 10\ \log_{10}(10^{\Delta No/10}-1) + (10\ \log_{10}(NeqBW)+6\ dB)$$

where $\lceil \rceil \div$ denotes the ceiling function, $\Delta No$ is the allowable G/T degradation, and $Neq\_BW$ is the noise equivalent bandwidth. The 6 dB in the above equation accounts for the maximum peak-to-peak receive-chain gain variation.

It should be noted that, under high Pr/No conditions when the number of hops-per-frame is low or the downlink is scintillating, clipping could occur if the actual loading factor were achieved for noise-only hops. This is one of the reasons that large gain error detection and long attack/release times are used.

A determination of the loop parameter is discussed below. When the new gain is less than a prescribed value (e.g., −16.4, as a non-limiting example) an out-of-range (OOR) fault high is set by the gain profile vector operator and the gain is clipped to the value of −16.4.

The primary AGC loop bandwidth, and thus the attack and release times, are set by the loop parameter $K_p\_S$. The loop updates for a given frequency bin at random time intervals due to the frequency hopping nature of the downlink. Thus, the attack and release times are random variables that are functions of the probability of visiting a given frequency bin on a given hop and the hopping period.

To handle gain errors that can cause ADC saturation or underflow for a large number of hops, a secondary gain adjustment mechanism is included in the AGC mechanism. A functional operator labeled "Large Gain Error Detection & OOR Low Error Detection" performs a large gain error (LGE) handing technique effectively that adapts the AGC's loop bandwidth when large gain errors are detected. The LGE technique permits setting different thresholds for low or high gain errors—thus permitting the LGE attack and releases times to be set differently. For detecting a persistent ADC underflow caused by a demodulator input failure (i.e. receive chain fault), the input signal strength is checked continuously against a minimum signal level threshold set by the receiver's noise floor. This out of range (OOR) low fault is detected using the same period as the LGE detector, but also uses the current gain setting for the corresponding frequency bin in the detection. An indication of an out of range low indicates a problem with the receive chain that will affect the system's communications performance.

Due to the frequency selective nature of the AGC mechanism of the present invention, a method for determining the presence of a large narrow band interfering signal in the receive band is readily available. The AGC gross interference detection algorithm uses the maximum gain variation between any two frequency bins to detect the presence of such an interferer. When a gross interferer is detected, the AGC function reports a gross downlink interference fault with a center frequency estimate of the band in which the interferer lies. It may be noted that the accuracy of the gross interferer's center frequency is a function of the analog anti-aliasing filter's bandwidth.

The AGC initializes and begins normal operation at the completion of the verification time-frequency search. The AGC mechanism will set the initial frequency dependent gain profile GP(0) equal to a 1-by-32 element vector of the appropriate gain extracted from a table. The AGC release time $T_{rls}$ and attack time $T_{atk}$ are defined to be the time for the AGC loop in a given frequency bin to settle to within 1 dB of final value after a step in input power in that bin of ±10 dB, respectively. It is intended that the AGC not track input signal variations due to scintillation; therefore, the AGC mean attack and release times need to be at least 10 times the max scintillation decorrelation time $\max(\tau_o)$ as defined by performance control specifications, thus allowing the AGC loop filter to ignore signal variations due to scintillation. To set the attack/release time the AGC loop's step response and mean time between observations must be determined.

An AGC loop is formed for a given frequency bin $\lambda$, of a plurality of frequency bins such as the 32 bin gain profile of the present example. Without a loss in generality, a new input at the $m^{th}$ observation may be defined as $P\sim_{in}^{(\lambda)}(m)=P_{in}^{(\lambda)}(m)-LF_{opt}$. This new input is simply a shifted version of $P_{in}^{(\lambda)}(m)$; thus, a $\pm 10$ dB step in $P_{in}^{(\lambda)}(m)$ equates to a $\pm 10$ dB step in $P\sim_{in}^{(\lambda)}(m)$. The attack/release times then become the time for the gain error $E_{gain}^{(\lambda)}(m)$ to decay to $\pm 1$ dB after a step of $\pm 10$ dB step in $P\sim_{in}^{(\lambda)}(m)$.

The transfer function of the AGC loop is:

$$H_{AGC}(z)=(z^{-1}-1)/(1-z^{-1}+K_{p\_S}z^{-D})$$

The step response is:

$$h_{AGC}^{step}(m)=Z^{-1}[-10/(1-z^{-1}+K_{p\_S}z^{-D})]$$

where $Z^{-1}[\ ]$ denotes the inverse Z-transform. Calculating the inverse z-transform in the above expression analytically as a function of the loop delay D is not practical; instead the step response is numerically evaluated at several values of D.

Due to the frequency hopping nature of the downlink, the sample interval, or time between observations, $T_{AGC}$, for a given frequency bin is random, so that the attack/release times are random. As described above, the objective is to set the mean attack/release time to be $10^*\max(\tau_o)$. Thus, it is necessary to derive the expectation of $T_{AGC}$. Assuming that every frequency hop word is equally likely, the probability $p_{AGC\_Bin}$ that a given hop equates to a particular frequency bin is defined as:

$$p_{AGC\_Bin}=1/32 \text{ for the non-limiting case described here.}$$

The expectation $E[T_{AGC}]$ is therefore defined as:

$$E[T_{AGC}] = \sum_{k=0}^{INFINITY} kT_{hop}p_{AGCbIN}(1-p_{AGC\,Bin})^{k-1}$$

$$= \frac{T_{HOP}p_{CAGC\,Bin}}{(1-p_{CAGC\,bIN})}\sum_{k=0}^{INFINITY}k(1-P_{CAGC\,Bin})^k$$

where $T_{hop}$ is the hopping interval. From a published transform, the above equation converts to:

$$\sum_{k=0}^{infinity}k(1-p_{AGC\,Bin})^k = \frac{1-p_{AGC\,Bin}}{(p_{AGC\,Bin})^2}$$

Therefore, the expectation $E[T_{AGC}]$ reduces to:

$$E[T_{AGC}]=T_{hop}/P_{AGC\_Bin}$$

The step response for the AGC in a given frequency bin may be is plotted for different values of $K_p\_S$ and D as a function of time, normalized by $T_{hop}/\max(\tau_o)$. As expected, the step response follows an exponential decay for all possible values of D, so that the proportional gain parameter $K_p\_S$ may be set as a function of desired attack/release time by the expression:

$$K_p\_S=2.3*E[T_{AGC}]/(10*\max(\tau_o))=2.3*T_{hop}/(10*p_{AGC\_Bin}*\max(\tau_o))$$

The large gain error (LGE) handling function of the AGC mechanism of the present invention adapts the loop's attack/release time when gain errors that exceed the LGE_high_S and LGE_low_S thresholds. These are set to $\pm 10$ dB to handle gain errors that prevent the magnitude of the gain error from being greater than 1 dB for more than 10 times the max scintillation decorrelation time $\max(\tau_o)$. To accomplish this, the gain in a frequency bin is adjusted in 3 dB steps when a large gain error is "detected". LGE detection is based on level crossings with the detection estimation period set by LGE_cnt_mod_S to be approximately two frame periods, in expectation. Each time the gain error exceeds the gain error threshold, the gain error count (high or low) for the corresponding frequency bin is incremented. If the ISSI measurement coincided with a hop that had a known valid hop, and exceeded the LGE high threshold, the LGE high count is incremented by 1 plus LGE_valid_hop_weight_S and the LGE_low counts are reset to 0. Once the LGE high or low count for a frequency bin exceeds the LGE_error_cnt_low_max_S or LGE_error_cnt_high_max_S in a frequency bin, the bin's gain is adjusted by 3 dB and the counts for that bin are reset. Every LGE_cnt_mod_S counts, all counters are reset if neither the LGE_error_cnt_low_max_S nor the LGE_error_cnt_high_max_S count is exceeded. To disable either the LGE high or low handling algorithm, LGE_error_cnt_high_max_S or LGE_error_cnt_low_max_S, respectively, is set to a value greater than LGE_cnt_mod_S.

The out-of-range (OOR) low detection function is used to determine when the demodulator's input is below acceptable levels. The threshold is used in conjunction by the LGE low detection algorithm, with OOR_Low_threshold_S threshold in-lieu of the LGE_low_S threshold for detecting the OOR low fault. The OOR low threshold OOR_Low_threshold_S is set using the equation below for each AG type. The minimum noise power spectral densities assume that the gain from the LNA input to demodulator input vary by less than 3 dB. It may be noted that the $\pm 3$ dB gain deviation includes both frequency dependent and non-frequency dependent gain variations due to installation/calibration errors, temperature, etc.

$$a \cdot OOR\_Low\_threshold\_S = LF_{opt} - \min(N_o) - 10\log_{10}(N_{eq}\_BW) + 3 \text{ dB}$$

The 3 dB factor is included to add margin against false alarms.

A gross interference detection algorithm is executed by a gross interference detector, which uses the peak-to-peak gain deviation, to determine if a high power interferer is present in the receive band and makes an estimate of the interferers center frequency. The peak-to-peak gain deviation threshold CID_threshold_S is set at the maximum peak-to-peak frequency deviation, plus 3 dB. The peak-to-peak gain deviation in the gain profile is sampled several times a second, and if the deviation exceeds the threshold, a gross interferer detected fault is set and a frequency estimate is made by centroiding between the frequency bins with the minimum gain. The accuracy of the frequency estimate is dependent on the anti-aliasing filter used and is approximately equal to half of the noise equivalent bandwidth of the filter.

DETAILED DESCRIPTION

Figure 1:
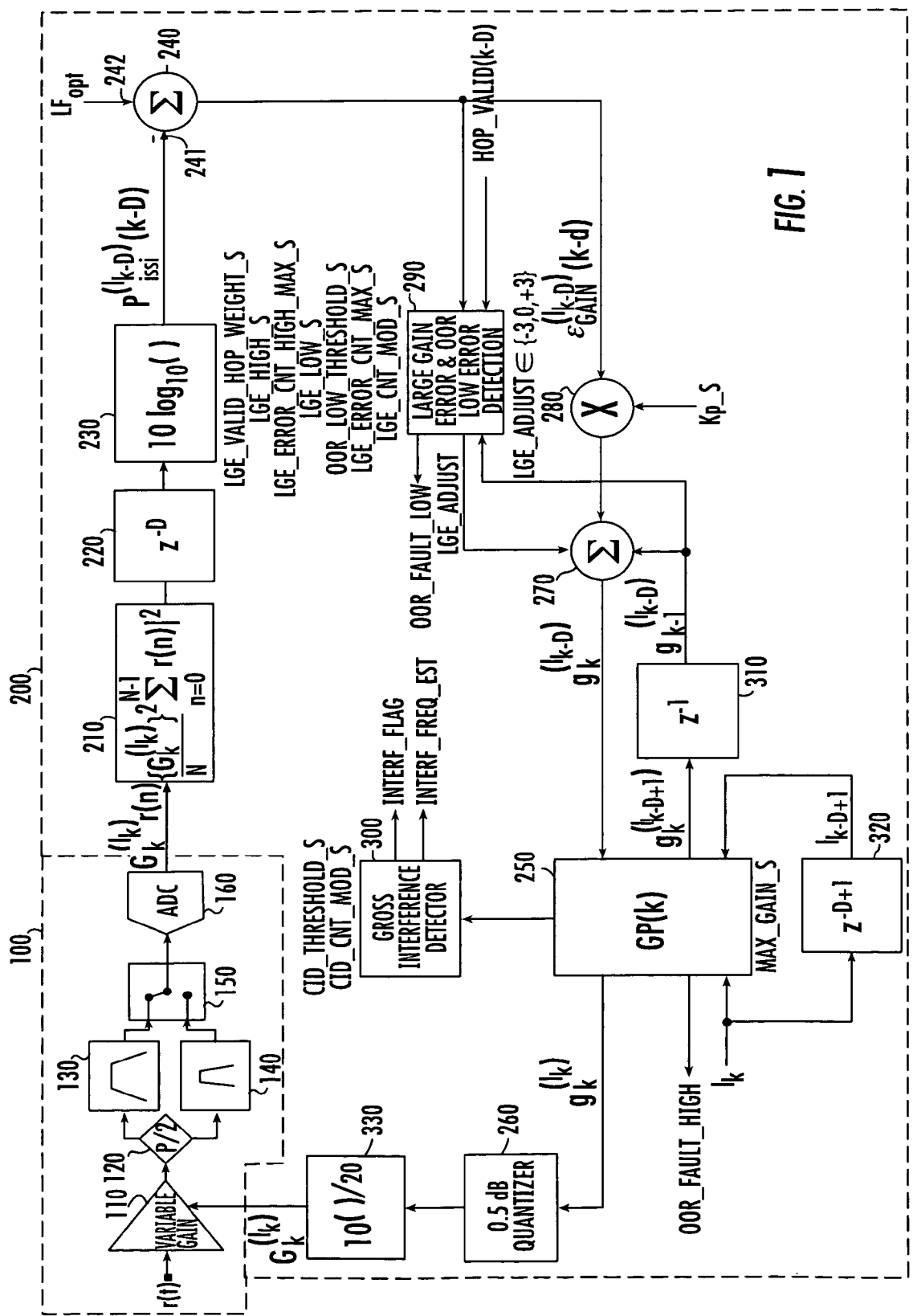
FIG. 1 is a functional block diagram of the overall architecture of the frequency selective automatic gain control function with dual attack and release times and interference detection.

Before describing the present invention, it should be observed that the invention resides primarily in a prescribed novel arrangement of conventional telecommunication circuits and components, and attendant communication control software in an attendant digital signal processor. As a result, the configuration of such circuits and components and the manner in they are interfaced with the communications control software have, for the most part, been depicted in the drawings by readily understandable functional block diagrams, that contain operational flow processing therein, which show only those specific aspects that are pertinent to the present invention, so as not to obscure the disclosure with details which will be readily apparent to those skilled in the art having the benefit of the description herein. Thus, the block diagram and associated communication control flow diagrams are primarily intended to show the major components of a preferred embodiment of the invention in convenient functional groupings, whereby the present invention may be more readily understood.

Frequency Selective Automatic Gain Control Mechanism

Attention is initially directed to FIG. 1, which is a functional-based block diagram of the overall architecture of the frequency selective automatic gain control function with dual attack and release times in accordance with a preferred embodiment of the present invention. The invention includes a front-end hardware section 100 through which a signal is received, and an associated digital processor-resident software section 200, to which the output of the hardware section is coupled, and which is used to control the gain of a variable gain stage 110 of the hardware section in accordance with a multifrequency bin-based gain profile developed by the software section in the course of its analysis of the energy in the various frequency bins to which the receiver hops. Pursuant to a preferred embodiment, the frequency selective automatic gain control (AGC) function is implemented in the demodulators digital signal processor section 200 and is responsible for maintaining the aggregate signal plus noise plus interference (herein referred to as the aggregate input signal) within the dynamic range of an analog-to-digital converter (ADC) 160 as well as for detecting demodulator input signal out of range faults and gross downlink interference. As will be described, the AGC function uses a frequency selective, first order, automatic gain control algorithm to control the demodulator mezzanine's gain to keep the average aggregate input signal power at the optimal ADC loading factor.

The aggregate input signal r(t) is coupled to a software controlled variable gain stage 110, the output of which is coupled through a splitter/divider 120 to a wideband filter stage 130 and to a narrowband filter stage 140, in this non-limiting example. The use of the two filters in the figure is necessary for the system in which the receiver is used and is not relevant to present invention other than the filter selected for a particular system configuration acts as an anti-aliasing filter. The output of one of these stages is selected by way of a selection switch 150 and is coupled to the input of ADC 160. The digital quantity produced by ADC 160 corresponds to the received signal r(n) multiplied by a prescribed gain quantity $G_k^{(lk)}$ supplied to the variable gain stage 110 from the gain profile-generating software section 200. The power in this signal sample representation is derived in power calculation block 210, which derives the quantity:

$$\frac{(G_k^{(lk)})^2}{N} \sum_{n=0}^{N-1} |r(n)|^2$$

This quantity is delayed in a delay block 220 to account for propagation delay in the execution of operations in the digital signal processor, to be described, and then converted into logarithmic format in a log base 10 conversion stage 230, to produce a measured and gain adjusted signal energy quantity $P_{issi}^{(lk-D)}$ (k–D), which is supplied in turn to an inverting (–) input 241 of summation operator 240, to the non-inverting (+) input 242 of which is supplied the optimal loading factor $LF_{opt}$.

Figure 2:
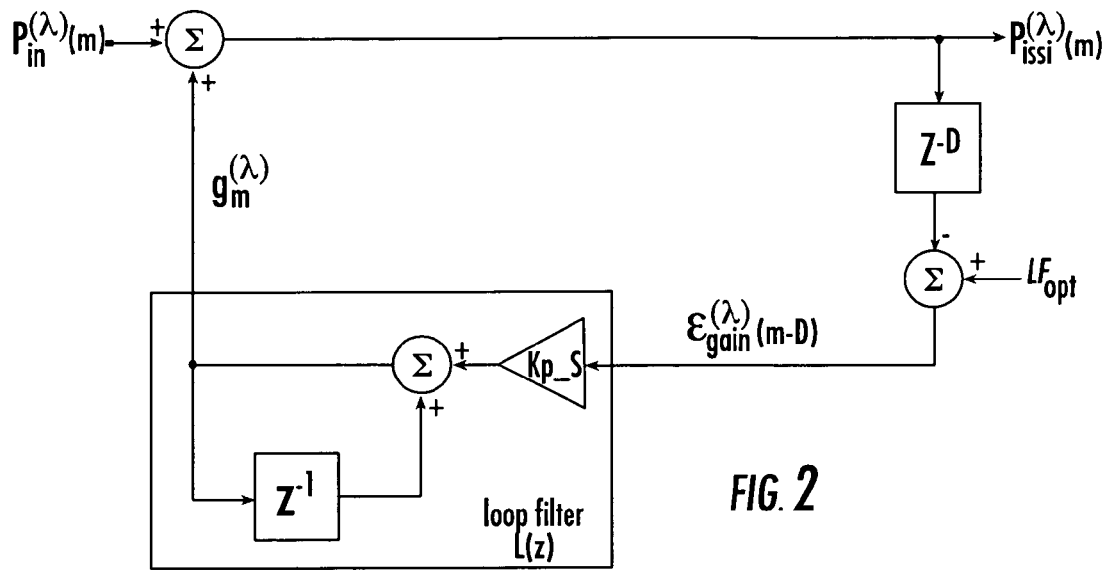
FIG. 2 depicts a AGC individual frequency bin loop for a given frequency bin λ.

As described briefly above, and as will be detailed below, the AGC algorithm is frequency selective, and adapts to different aggregate input signal conditions in a prescribed number of frequency bins (such as 32 bins as a non-limiting example, as shown in FIG. 2. The frequency bin for a given hop is based on the hop's center frequency.

The AGC function initializes and starts the AGC frequency selective mechanism with a pre-determined initial gain profile.

As pointed out above, the AGC mechanism of the present invention is a frequency selective, dual bandwidth, first order, automatic gain control loop. The respective components of the AGC mechanism are shown in FIG. 1 and run a dual bandwidth AGC loop in each of up to 32 frequency bins in the present example, with each frequency bin AGC_Bin corresponding to a range of frequencies the systems operating band. Due to the random frequency hopping on the downlink, the frequency bin sampling period is random.

For each hop, the digital signal processing entity calculates a 16-bit input signal strength indicator (ISSI) value as $$issi(k) = \text{round}\left(\frac{1}{4*44,352} \sum_{n=0}^{44,351} |x_k(n)|^2\right) \quad (1)$$

where x(n) is a ten-bit ADC sample for the kth hop interval.

Once the frequency bin $l_k$ is determined for the hop, the gain setting (in dB), $g_k^{(lk)}$, for that frequency bin is looked up in the current gain profile vector GP(k) 250, and quantized to a 0.5 dB step size by 0.5 dB Quantizer operator 260. It should be noted that the gain profile vector is stored in an unquantized, floating point format to avoid setting an upper limit on the AGC's attack/release time.

Once the AGC function receives the ISSI-vector from the hardware, the algorithm uses the ISSI vector, along with the corresponding vector of frequency bins, to calculate a gain error for the $k^{th}$ hop as:

$$E_{gain}^{(lk)}(k)=LF_{opt}-10\,LOG_{10}(issi(k)/2^{15})$$

The loading factor is defined as the ratio of the average power of the aggregate input signal to the power of a sine wave with an amplitude equal to the ADC's full scale. The loading factor $LF_{opt}$ is determined via analysis based on analysis to be the loading factor that optimizes the effects of quantization on the incoming desired signal. For a 10-bit ADC, a full scale sine wave will result in an ISSI measurement of 32,640 which is approximated as $2^{15}$ in equation (4). The gain error from summation operator 270 is then used to update the gain profile value for the corresponding frequency bin as shown in FIG. 1.

Selecting the Optimal Loading Factor

As noted above, the loading factor is defined as the ratio of the average power of the aggregate input signal to the power of a sine wave with it's amplitude equal to the ADC's full scale. If an ADC is underloaded, the digital demodulator's ADC quantization noise can degrade the terminals G/T. The loading factor is selected such that the AWGN noise density at the input to the ADC is increased by no more than an amount determined during the demodulator implementation loss budget allocation process. The loading factor $LF_{opt}$ is set to:

$$LF_{opt}=\lceil \backslash ADC\_No-10\,\log_{10}(10^{\Delta No/10}-1)+ \\ 10\,\log_{10}(NeqBW)+6\,dB\rceil \div$$
(5)

where $\lceil \backslash \div$ denotes the ceiling function, $\Delta No$ is the allowable noise density increase, and Neq_BW is the noise equivalent bandwidth. The 6 dB in equation (5) serves to account for the maximum peak-to-peak receive-chain gain variation.

It should be noted that, under high Pr/No conditions when the number of hops per frame is low or the downlink is scintillating, that clipping could occur if the actual loading factor where achieved for noise only hops. This is one of the reasons that large gain error detection and long attack/release times are used.

A determination of the loop parameter is discussed below. When the new gain is less than a prescribed minimum allowable value an out of range (OOR) fault high is set by the gain profile vector operator 250 and the gain is clipped to the minimum allowable value. This fault is considered a minor fault. When the new gain is greater than the max gain, MAX_GAIN_S, the gain is clipped to MAX_GAIN_S. It may be noted that MAX_GAIN_S is often selected to be the required gain to get the minimum input noise only power to $LF_{opt}$. The out of range low fault is handled in conjunction with the large gain error detection discussed below.

The primary AGC loop bandwidth, and thus the attack and release times, are set by the loop parameter $K_p\_S$, which is supplied to gain error multiplier 280. The loop updates for a given frequency bin at random time intervals due to the frequency hopping nature of the downlink. Thus, the attack and release times are random variables that are functions of the probability of visiting a given frequency bin on a given hop and the hopping period.

To handle gain errors that can cause ADC saturation or underflow for more than one or two frames, a secondary gain adjustment mechanism is included in the AGC mechanism. The functional operator 290 labeled "Large Gain Error Detection & OOR Low Error Detection" in FIG. 1 performs a large gain error (LGE) handing technique that effectively adapts the AGC's loop bandwidth when large gain errors are detected. The LGE technique permits setting different thresholds for low or high gain errors—thus permitting the LGE attack and releases times to be set differently. For detecting a persistent ADC underflow caused by a demodulator input failure (i.e. receive chain fault), the input signal strength is continuously checked against a minimum signal level threshold set by the receiver's noise floor. This out of range (OOR) low fault is detected using the same period as the LGE detector, but also uses the current gain setting for the corresponding frequency bin in the detection. The Hop_Valid flag indicates an ISSI value corresponding to a hop in which the terminal expected a "valid hop" and is used to weight valid hops when determining a high large gain error condition exists, which resets the LGE low error counters for a used hop.

Due to the frequency selective nature of the AGC mechanism of the present invention, a method for determining the presence of a large narrow band interfering signal in the receive band is readily available. The AGC gross interference detection algorithm uses the maximum gain variation between any two frequency bins to detect the presence of such an interferer. When a gross interferer is detected, the AGC function reports a gross downlink interference fault with a center frequency estimate of the band in which the interferer lies. It may be noted that the accuracy of the gross interferer's center frequency is a function of the analog anti-aliasing filter being used and is accurate to approximately half the noise equivalent bandwidth of this filter.

Setting the AGC's Attack & Release Times

The AGC release time $T_{rls}$ and attack time $T_{atk}$ are defined to be the time for the AGC loop in a given frequency bin to settle to within ±1 dB of final value after a step in input power in that bin of ±10 dB, respectively. It is intended that the AGC not track input signal variations due to scintillation; therefore, the AGC mean attack and release times need to be 10 times the max scintillation decorrelation time $\max(\tau_o)$, thus allowing the AGC loop filter to ignore signal variations due to scintillation. To set the attack/release time the AGC loop's step response and mean time between observations must be determined.

AGC Loop Step Response

Figure 4:
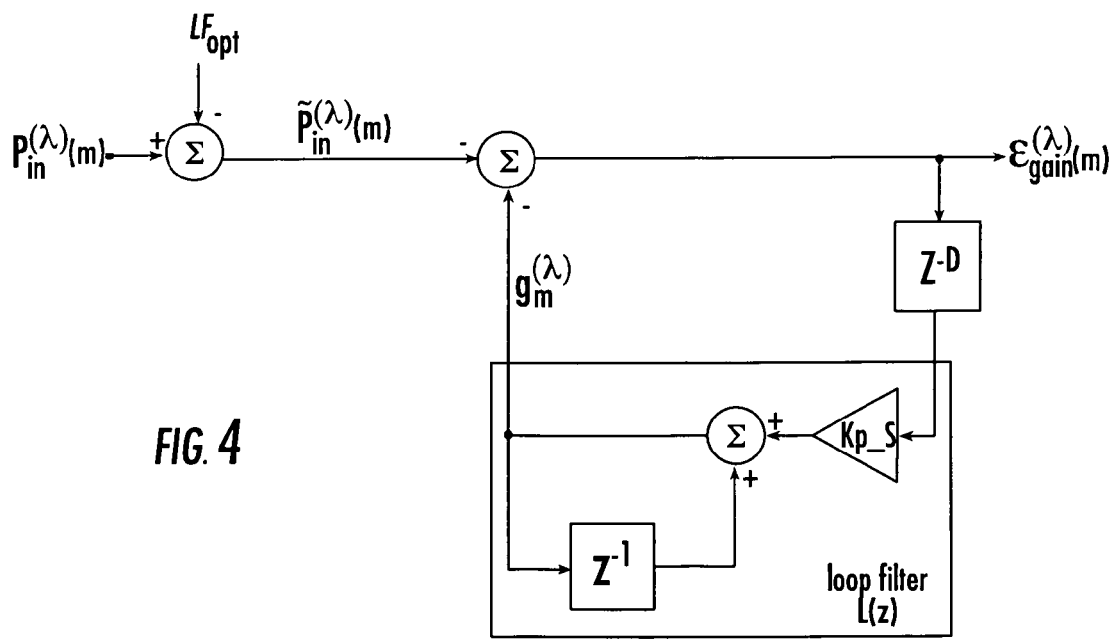
FIG. 4 depicts a AGC individual frequency bin loop analysis model.
Figure 3:
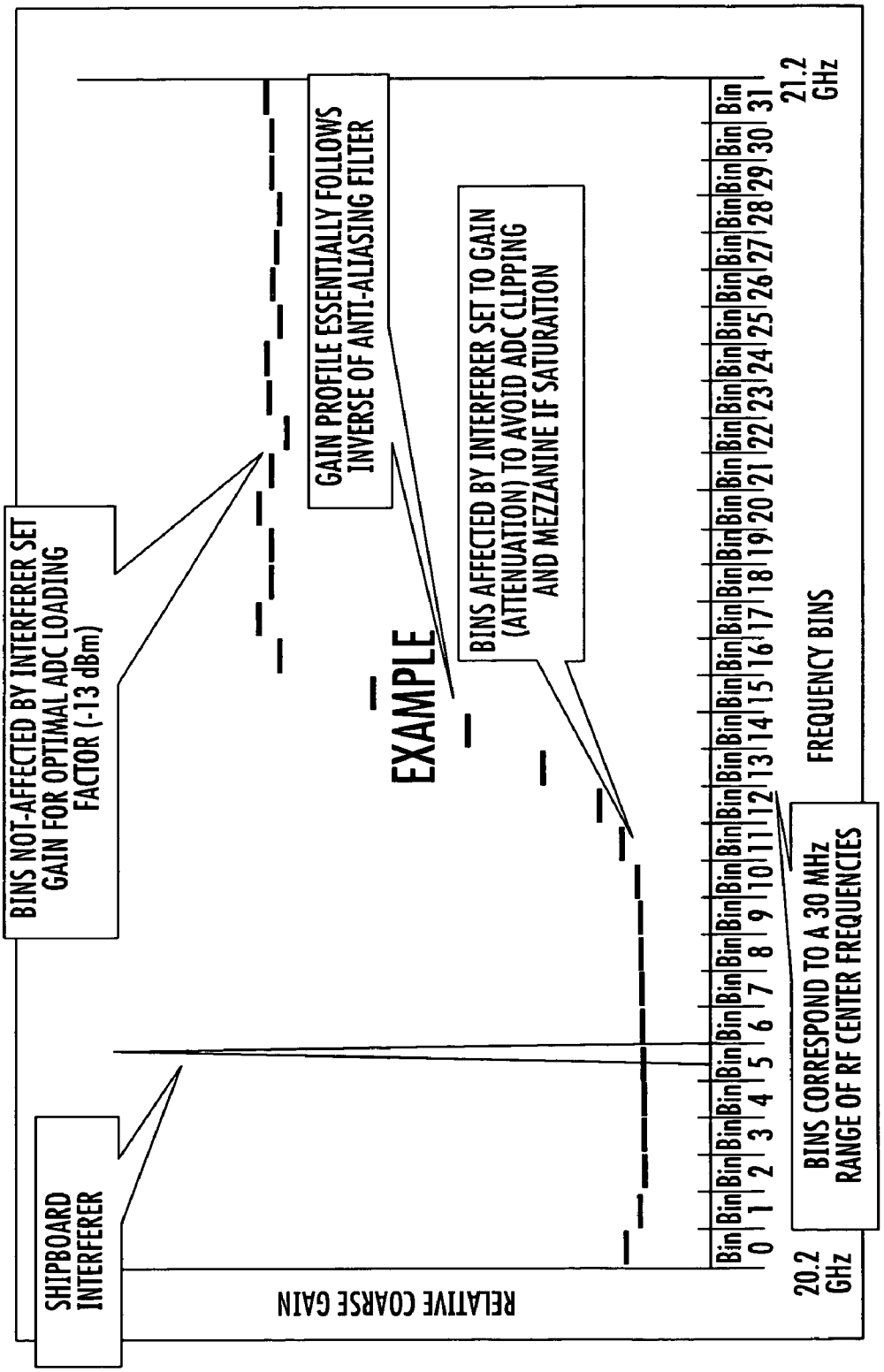
FIG. 3 shows a gain profile derived in accordance with the architecture of FIG. 1.

The AGC loop is shown in FIG. 2 for a given frequency bin $\lambda$ of a plurality of frequency bins such as the 32 bin gain profile of the present example shown in FIG. 3. Without a loss in generality, a new input at the $m^{th}$ observation may be defined as $P\sim_{in}^{(\lambda)}(m)=P_{in}^{(\lambda)}(m)-LF_{opt}$ as shown in FIG. 4. This new input is simply a shifted version of $P_{in}^{(\lambda)}(m)$; thus, a ±10 dB step in $P_{in}^{(\lambda)}(m)$ equates to a ±10 dB step in $P\sim_{in}^{(\lambda)}(m)$. The attack/release times then become the time for the gain error $E_{gain}^{(\lambda)}(m)$ to decay to ±1 dB after a step of ±10 dB step in $P\sim_{in}^{(\lambda)}(m)$.

From FIG. 4, it can be seen that the transfer function of the AGC loop is:

$$H_{AGC}(z)=(z^{-1}-1)/(1-z^{-1}+K_{p\_}Sz^{-D})$$

The step response is then:

$$h_{AGC}^{step}(m)=Z^{-1}[-10/(1-z^{-1}+K_{p\_}Sz^{-D})]$$

where $Z^{-1}[\,]$ denotes the inverse Z-transform. Calculating the inverse z-transform in the above expression analytically as a function of the loop delay D is not practical; instead the step response is numerically evaluated at several values of D.

Due to the frequency hopping nature of the downlink, the sample interval, or time between observations, $T_{AGC}$, for a given frequency bin is random, so that the attack/release times are random. As described above, the objective is to set the mean attack/release time to be $10*\max(\tau_o)$. Thus, it is necessary to derive the expectation of $T_{AGC}$. This is derived as set forth below. Assuming that every frequency hop word is equally likely, the probability $p_{AGC\_Bin}$ that a given hop equates to a particular frequency bin is $p_{AGC\_Bin}=\frac{1}{32}$ for non-limiting example here.

The expectation $E[T_{AGC}]$ is therefore defined as:

$$E[T_{CAGC}] = \sum_{k=0}^{INFINITY} kT_{hop}p_{CAGC\,bIN}(1 - p_{CAGC\,Bin})^{k-1}$$

$$= \frac{T_{HOP}p_{CAGC\,Bin}}{(1 - p_{CAGC\,bIN})} \sum_{k=0}^{INFINITY} k(1 - P_{CAGC\,Bin})^k$$

where $T_{hop}$ is the hopping interval. From pg 7, equation 0.231.2, of the textbook by Gradshteyn & Ryzhik, entitled "Tables of Integrals, Series, and Products", Academic Press, 1980, the above equation converts to:

$$\sum_{k=0}^{infinity} k(1 - p_{CAGC\,Bin})^k = \frac{1 - p_{CAGC\,Bin}}{(p_{CAGC\,Bin})^2}$$

Therefore, the expectation $E[T_{AGC}]$ reduces to:

$$E[T_{AGC}] = T_{hop}/p_{AGC\_Bin}$$

Figure 5:
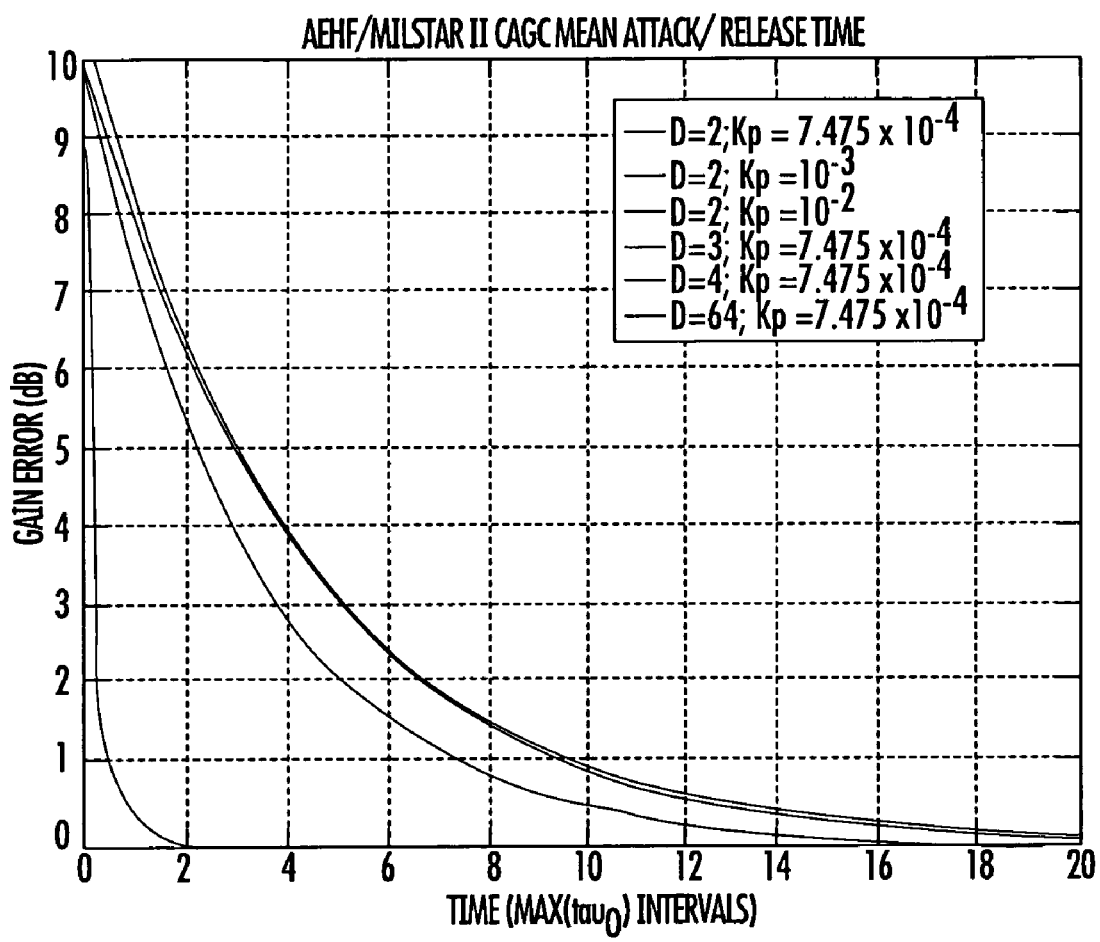
FIG. 5 graphically shows AGC step response with a wide band filter.

The step response for the AGC in a given frequency bin is plotted in FIGS. 5 and 6 for different values of $K_P\_S$ and D as a function of time, normalized by $T_{hop}/\max(\tau_o)$. As expected, the step response follows an exponential decay for all possible values of D, so that the proportional gain parameter $K_p\_S$ may be set as a function of desired attack/release time by the expression:

$$K_p\_S=2.3*E[T_{AGC}]/(10*\max(\tau_o))=$$
$$2.3*T_{hop}/(10*p_{AGC\_Bin}*\max(\tau_o))$$

It may be noted that the loop delay is limited by the collection/processing epoch of the present example to 32 hop interval. It can be expected that the DSP processing will take less than 32 hop intervals to complete; therefore, if every hop were to be in a given frequency bin, the delay could be as much as 2*32 or 64 hop intervals.

Large Gain Error Handling Thresholds and Period

The large gain error (LGE) handling function of the AGC mechanism of FIG. 1 adapts the loop's attack/release time when gain errors that exceed the LGE_high_S and LGE_low_S thresholds. These are set to ±10 dB to handle gain errors that prevent the magnitude of the gain error from being greater than 1 dB for more than 10 times the max scintillation decorrelation time $\max(\tau_o)$. To accomplish this, the gain in a frequency bin is adjusted in ±3 dB steps when a large gain error is "detected". LGE detection is based on level crossings with the detection estimation period set by LGE_cnt_mod_S to be approximately two frame periods, in expectation. Each time the gain error exceeds the gain error threshold, the gain error count (high or low) for the corresponding frequency bin is incremented. If the ISSI measurement coincided with a hop that had a known valid hop, and exceeded the LGE high threshold, the LGE high count is incremented by 1 plus LGE_valid_hop_weight_S and the LGE low counts are reset to 0. Once the LGE high or low count for a frequency bin exceeds the LGE_error_cnt_low_max_S or LGE_error_cnt_high_max_S in a frequency bin, the bin's gain is adjusted by ±3 dB and the counts for that bin are reset. Every LGE_cnt_mod_S counts, all counters are reset if neither the LGE_error_cnt_low_max_S nor the LGE_error_cnt_high_max_S count is exceeded.

To disable either the LGE high or low handling algorithm, LGE_error_cnt_high_max_S or LGE_error_cnt_low_max_S, respectively, is set to a value greater than LGE_cnt_mod_S.

Out-of-Range Error Low Thresholds

The out-of-range (OOR) low detection function 290 is used to determine when the aggregate input is below acceptable levels. The threshold is used in conjunction by the LGE low detection algorithm, with OOR_Low_threshold_S threshold in-lieu of the LGE_low_S threshold for detecting the OOR low fault.

The OOR low threshold OOR_Low_threshold_S is set using the equation below. Note that the ±3 dB gain deviation includes both frequency dependent and non-frequency dependent gain variations due to installation/calibration errors, temperature, etc.

OOR_Low_threshold_$S$=LF$_{opt}$-min($N_o$)-10 log$_{10}$($N_{eq}$_BW)+3 dB

The parameter min($N_o$) is application specific. The noise equivalent bandwidth is designated as $N_{eq}$_BW. The 3 dB factor is included to add margin against false alarms.

Interference Detection Algorithm

A gross interference detection algorithm is executed by gross interference detector 300, which uses the peak-to-peak gain deviation among frequency bins, to determine if a high power interferer is present in the receive band and makes an estimate of the interferers center frequency. FIG. 1 also shows time delays 310 and 320 that ensure time alignment of variables being processed, as well as an exponential operator to convert the log$_{10}$ format of the data into that for driving the variable gain stage 110. The peak-to-peak gain deviation threshold CID_threshold_S is set at the maximum peak-to-peak frequency deviation, plus 3 dB. The peak-to-peak gain deviation in the gain profile is sampled several times a second, and if the deviation exceeds the threshold, a gross interferer detected fault is set and a frequency estimate is made by centroiding between the frequency bins with the minimum gain. The accuracy of the frequency estimate is dependent on the anti-aliasing filter used and is approximately equal to half of the noise equivalent bandwidth of the filter.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed:

1. A method of controlling gain of an input to a receiver having an analog-to-digital converter (ADC) through which received signals are digitized for downstream processing in the course of recovering information contained in said received signals, said method comprising the steps of:

(a) frequency-hopping said receiver among a plurality of frequency bins and measuring received energy in respective ones of said plurality frequency bins;

(b) in response to received energy measured in step (a) developing a gain profile across the frequency range of said plurality of frequency bins;

(c) controlling the gain of said input to said receiver in accordance with said gain profile developed in step (b); and (d) determining the presence of a high power interferer within the frequency range in accordance with a peak-to-peak gain deviation among frequency bins of said plurality of frequency bins, and generating an estimate of the center frequency of said high power interferer.

2. The method according to claim 1, wherein step (c) comprises controlling the gain of said input to said receiver so as to optimize a quantization range of said ADC for a received signal, irrespective of which of said frequency bins of said plurality said receiver is tuned to.

3. The method according to claim 1, wherein step (c) comprises controlling the gain of said input to said receiver in accordance with the gain profile developed in step (b) so as to adjust, on a bin-by-bin basis, the gain for the frequency bin to which the receiver is listening, to maintain an average aggregate input signal power at an optimal ADC loading factor.

4. The method according to claim 1, wherein step (b) comprises reducing an amplitude of said gain profile at and in the vicinity of a frequency bin detected to contain a prescribed excess amount of energy and increasing the amplitude of said gain profile at and in the vicinity of a frequency bin detected to contain less than a predetermined amount of energy.

5. The method according to claim 4, wherein step (b) comprises reducing the amplitude of said gain profile to an attenuated value that is effective to avoid ADC clipping and mezzanine IF saturation at and in the vicinity of a frequency bin detected to contain a prescribed excess amount of energy.

6. The method according to claim 5, wherein step (b) comprises setting the amplitude of said gain profile for optimal ADC loading factor at and in the vicinity of a frequency bin detected to contain less than a predetermined amount of energy.

7. The method according to claim 1, wherein said gain profile essentially conforms with an inverse of an anti-aliasing filter coupled to the ADC.

8. The method according to claim 1, wherein step (a) comprises frequency-hopping said receiver among said plurality of frequency bins in an aperiodic random manner.

9. The method according to claim 1, wherein said peak-to-peak gain deviation has a threshold set at the maximum peak-to-peak frequency deviation, plus a prescribed offset, and wherein step (d) comprises determining of the presence of said high power interferer in response to the peak-to-peak gain deviation in said gain profile exceeding said threshold.

10. The method according to claim 9, wherein a frequency estimate of said high power interferer is made by centroiding between frequency bins with minimum gain.

11. The method according to claim 1, further comprising the step (d) of generating an out-of-range indication in response to the average aggregate input signal power being below a prescribed low threshold level representative of a minimum allowable value.

12. A receiver system for controlling the gain of a variable gain amplifier in the received signal flow path of the input to a receiver having an analog-to-digital converter (ADC) through which received signals are digitized for downstream processing in the course of recovering information contained in said received signals, said system comprising:

a frequency-hopping controller which is operative to frequency-hop said receiver among a plurality of frequency bins and to measure received energy in respective ones of said plurality frequency bins;

a received signal processor, which is coupled to the output of said frequency-hopping controller and is operative, in response to received energy measured thereby, to develop a gain profile across the frequency range of said plurality of frequency bins;

a gain profile controller, coupled to said received signal processor and said frequency hopping controller, and being operative to control the gain of said variable gain amplifier at said input to said receiver in accordance with said gain profile developed by said received signal processor; and a gross interference detector operative to determine the presence of a high power interferer within the frequency range in accordance with a peak-to-peak gain deviation among frequency bins of said plurality of frequency bins, and to generate an estimate of the center frequency of said high power interferer.

13. The receiver system according to claim 12, wherein said gain profile controller is operative to control the gain of said variable gain amplifier at said input to said receiver so as to optimize the quantization range of said ADC for a received signal, irrespective of which of said frequency bins of said plurality said receiver is tuned to.

14. The receiver system according to claim 12, wherein said gain profile controller is operative to control the gain of said variable gain amplifier at said input to said receiver in accordance with the gain profile developed by said received signal processor, so as to adjust, on a bin-by-bin basis, the gain for the frequency bin to which the receiver is listening, to maintain the average aggregate input signal power at an optimal ADC loading factor.

15. The receiver system according to claim 12, wherein said signal processor is operative to reduce the amplitude of said gain profile at and in the vicinity of a frequency bin detected to contain a prescribed excess amount of energy and to increase the amplitude of said gain profile at and in the vicinity of a frequency bin detected to contain less than a predetermined amount of energy.

16. The receiver system according to claim 15, wherein said signal processor is operative to reduce the amplitude of said gain profile to an attenuated value that is effective to avoid ADC clipping and mezzanine IF saturation at and in the vicinity of a frequency bin detected to contain a prescribed excess amount of energy.

17. The receiver system according to claim 16, wherein said signal processor is operative to set the amplitude of said gain profile for optimal ADC loading factor at and in the vicinity of a frequency bin detected to contain less than a predetermined amount of energy.

18. The receiver system according to claim 12, wherein said gain profile essentially conforms with an inverse of an anti-aliasing filter coupled to said ADC.

19. The receiver system according to claim 12, wherein said frequency-hopping controller is operative to frequency-hop said receiver among said plurality of frequency bins in an aperiodic random manner.

20. The receiver system according to claim 12, wherein said peak-to-peak gain deviation has a threshold set at the maximum peak-to-peak frequency deviation plus a prescribed offset, and wherein said gross interference detector ins operative to determine the presence of a high power interferer in response to the peak-to-peak gain deviation in said gain profile exceeding said threshold.

21. The receiver system according to claim 20, wherein a frequency estimate of said high power interferer is made by centroiding between frequency bins with minimum gain.

22. The receiver system according to claim 12, further comprising an out-of-range detector which is operative to generate an out-of-range indication in response to the average aggregate input signal power being below a prescribed low threshold level representative of a minimum allowable value.

23. An automatic gain control system for a dual bandwidth communications receiver having a front end variable gain stage that is operative to control the gain of a received signal that is coupled to an analog-to-digital converter (ADC) through which received signals are digitized for downstream processing in the course of recovering information contained in said received signals, said automatic gain control system comprising:
- a frequency-hopping controller which is operative to frequency-hop said receiver among a plurality of frequency bins and to measure received energy in respective ones of said plurality frequency bins;
- a received signal processor, which is coupled to the output of said frequency-hopping controller and is operative, in response to received energy measured thereby, to develop a gain profile across the frequency range of said plurality of frequency bins;
- a gain profile controller, coupled to said received signal processor and said frequency hopping controller, and being operative to control the gain of said variable gain stage in accordance with said gain profile developed by said received signal processor so as to adjust, on a bin-by-bin basis, the gain for the frequency bin to which the receiver is listening, to maintain the average aggregate input signal power associated with signal plus noise plus interference at an optimal ADC loading factor; and
- a gross interference detector operative to determine the presence of a high power interferer within the frequency range in accordance with a peak-to-peak gain deviation among frequency bins of said plurality of frequency bins, and to generate an estimate of the center frequency of said high power interferer.

24. The automatic gain control system according to claim 23, wherein said received signal processor is operative to compensate for large gain errors by controlled adaptation of the system's loop bandwidth, so as to maintain the average aggregate input signal power associated with signal plus noise plus interference at said optimal ADC loading factor.

25. The automatic gain control system according to claim 23, wherein said peak-to-peak gain deviation has a threshold set at the maximum peak-to-peak frequency deviation, plus a prescribed offset, and wherein said gross interference detector is operative to determine the presence of a high power interferer in response to the peak-to-peak gain deviation in said gain profile exceeding said threshold.

26. The automatic gain control system according to claim 25, wherein a frequency estimate of said high power interferer is made by centroiding between frequency bins with minimum gain.

27. The automatic gain control system according to claim 23, further comprising an out-of-range detector which is operative to generate an out-of-range indication in response to the average aggregate input signal power being below a prescribed low threshold level representative of a minimum allowable value.

\* \* \* \* \*